US008025520B1

(12) United States Patent
Li et al.

(10) Patent No.: US 8,025,520 B1
(45) Date of Patent: Sep. 27, 2011

(54) CABLE IMMOBILIZING DEVICE AND ELECTRONIC DEVICE HAVING THE SAME

(75) Inventors: Hong Li, Shenzhen (CN); Ting-Ting Zhao, Shenzhen (CN); Min-Li Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/848,198

(22) Filed: Aug. 1, 2010

(30) Foreign Application Priority Data

Jun. 23, 2010 (CN) .......................... 2010 1 0207592

(51) Int. Cl.
*H01R 13/62* (2006.01)

(52) U.S. Cl. ....................................... 439/371; 439/470

(58) Field of Classification Search .................. 439/371, 439/449, 470
See application file for complete search history.

(56) References Cited

U.S. PATENT DOCUMENTS

| 2,913,791 | A | * | 11/1959 | Martin | 24/136 R |
|---|---|---|---|---|---|
| 5,174,293 | A | * | 12/1992 | Hagiwara | 600/300 |
| 5,615,674 | A | * | 4/1997 | Maurer | 600/372 |
| 6,107,574 | A | * | 8/2000 | Chang et al. | 174/77 R |
| 6,126,462 | A | * | 10/2000 | Lam | 439/171 |
| 6,739,896 | B2 | * | 5/2004 | Sivertsen | 439/371 |
| 7,052,305 | B2 | * | 5/2006 | Kurokawa | 439/371 |
| 2010/0248527 | A1 | * | 9/2010 | West et al. | 439/371 |

* cited by examiner

*Primary Examiner* — Hien Vu
(74) *Attorney, Agent, or Firm* — Atlis Law Group, Inc.

(57) ABSTRACT

A cable immobilizing device for an electronic device. The cable immobilizing device includes a buckle and a sleeve. The buckle is fixed on a shell of the electronic device. The buckle includes two juts facing to each other. The two juts define a slot therebetween to receive a cable of the electronic device. The sleeve is configured to enclose the cable, the outer diameter of the sleeve is lager than the width of the slot.

8 Claims, 3 Drawing Sheets

CABLE IMMOBILIZING DEVICE AND ELECTRONIC DEVICE HAVING THE SAME

BACKGROUND

1. Technical Field

The present disclosure relates to cable immobilizing devices and, particularly, to a cable immobilizing device used in an electronic device. The present disclosure also relates to the electronic device using the cable immobilizing device.

2. Description of Related Art

Connectors, including plugs and sockets, are used in electronic devices to connect cables to, for example, printed circuit boards. However, for assembling and disassembling convenience, the plugs are not firmly connected to the sockets. Accordingly, cables may easily be accidentally disconnected.

What is needed, therefore, is a cable immobilizing device and an electronic device having same to overcome the above-described problem.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Embodiments of the present disclosure will now be described in detail below, with reference to the accompanying drawings.

Figure 1:
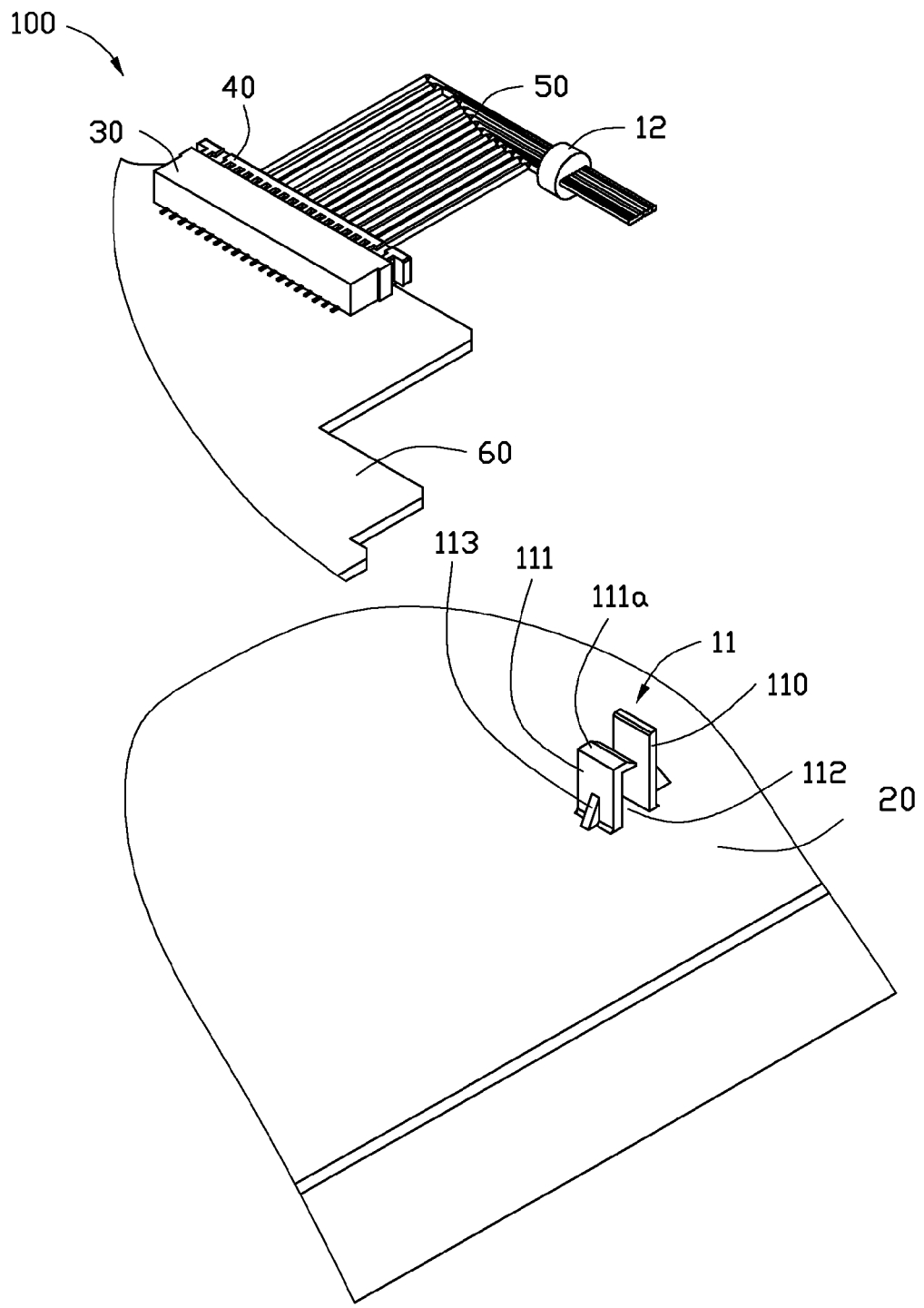
FIG. 1 is a schematic view of a cable immobilizing device according to one embodiment.
Figure 2:
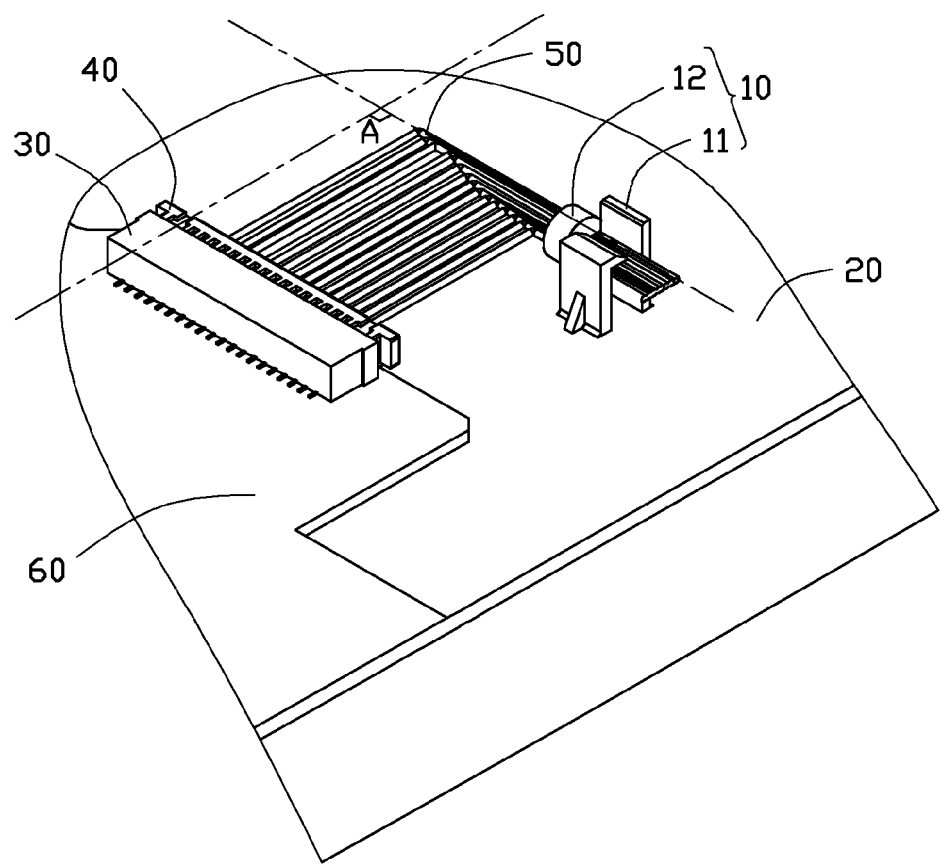
FIG. 2 is a schematic view of the cable immobilizing device of FIG. 1 fixed in an electronic device according to one embodiment.

Referring to FIGS. 1 and 2, a cable immobilizing device 10 according to one embodiment, is shown. The cable immobilizing device 10 is used for fixing cables 50 in an electronic device 100. The electronic device 100 includes a shell 20, a socket 30, a plug 40, and a circuit board 60. The other elements of the electronic device 100 are not shown.

The circuit board 60 is fixed in the shell 20. The socket 30 is electrically connected to and fixed on the circuit board 60. In other embodiments, the socket 30 can be directly fixed on the shell 20.

The cable immobilizing device 10 includes a buckle 11 and a sleeve 12. The buckle 11 is fixed on the shell 20, and adjacent to the socket 30. The buckle 11 is made of elastic material. The buckle 11 includes a first jut 110 and a second jut 111 opposite to each other. The first jut 110 and the second jut 111 cooperatively define a slot 112 therebetween to receive the cable 50. An angle A is defined between a longitudinal direction of the slot 112 and an inserting direction of the plug 40. The angle A is greater than 0 degrees, and less than 180 degrees. In the present embodiment, the angle A is 90 degrees. Because the cable 50 is received in the slot 112, an angle A exists between the extending direction of the cable 50 and the inserting direction of the socket 30, and it is not easy to detach the plug 40 and the socket 30 by simply pulling on the cable 50. The first jut 110 and the second jut 111 have plate-like structures. In other embodiments, the first jut 110 and the second jut 111 can be other shapes such as cylindrical. A hook 111a is formed on the distal end of the second jut 111. The hook 111a extends towards the first jut 110. Two ribs 113 are formed on the two opposite sides of the first jut 110 and the second jut 111 respectively. The ribs 113 are configured for increasing stiffness of the first jut 110 and the second 111 so they do not bend too easily.

Figure 3:
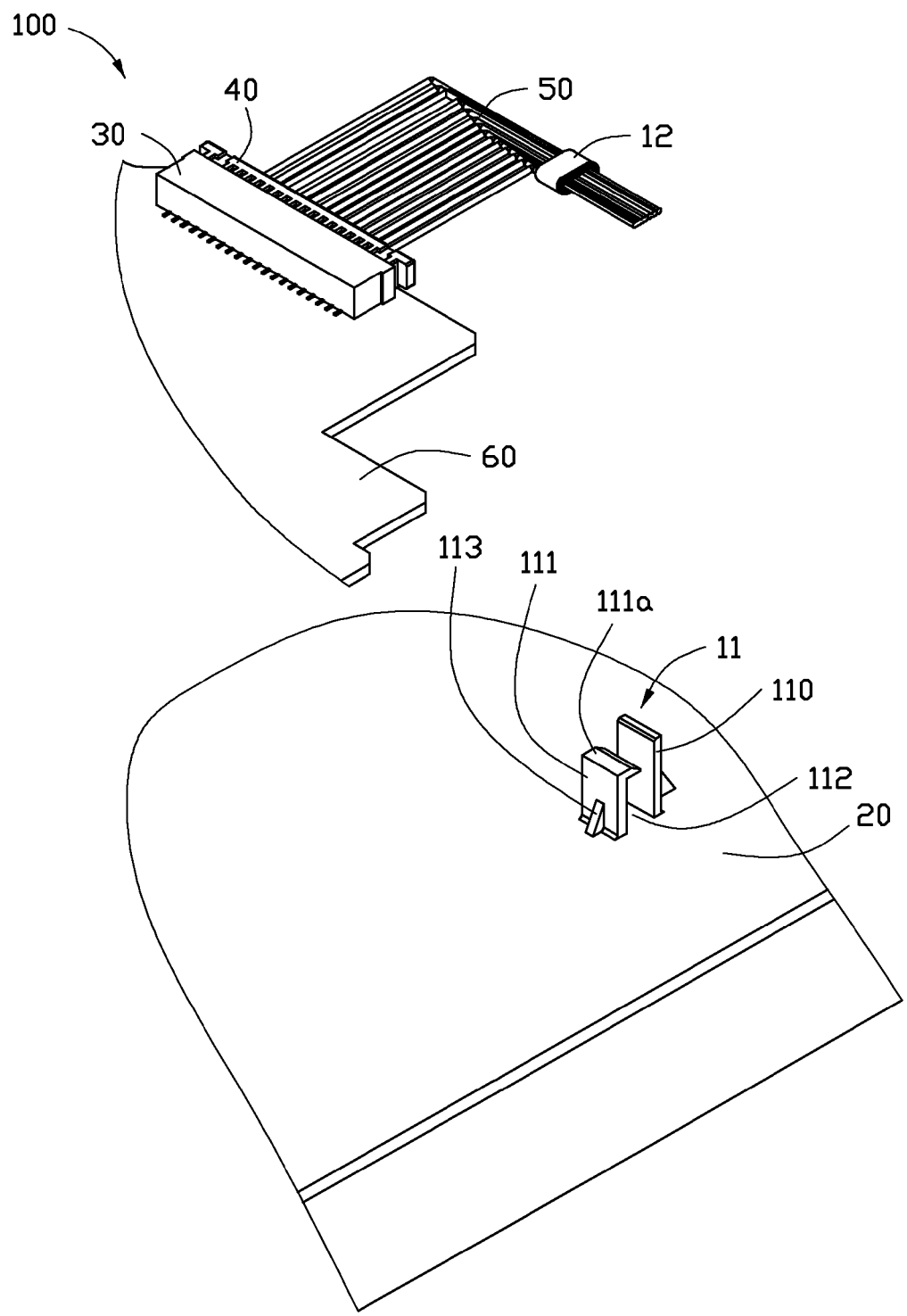
FIG. 3 is a schematic view of the cable immobilizing device of FIG. 1 having a sleeve formed by a coiled acetate cloth tape.

The plug 40 is connected to the cable 50, and coupled to the socket 30. The cable 50 is received in the slot 112 of the buckle 11. The sleeve 12 is fixedly sleeved on the cable 50, and disposed between buckle 11 and the socket 30. The outer diameter of the sleeve 12 is greater than the width of the slot 112. If the cable 50 is forcibly pulled, the sleeve 12 will be resisted against by the buckle 11 to prevent the cable 50 with the plug 40 from being accidentally pulled out. The sleeve 12 can be a plastic sleeve. The sleeve 12 can also be formed by coiled acetate cloth tape as shown in FIG. 3.

While certain embodiments have been described and exemplified above, various other embodiments will be apparent to those skilled in the art from the foregoing disclosure. The present disclosure is not limited to the particular embodiments described and exemplified, and the embodiments are capable of considerable variation and modification without departure from the scope of the appended claims.

What is claimed is:

1. A cable immobilizing device for an electronic device, comprising:
   a buckle for being positioned on a shell of the electronic device, the buckle comprising two juts facing to each other, the two juts defining a slot therebetween configured to receive a cable of the electronic device; and
   a sleeve configured to enclose surround an outer surface portion of the cable, and configured for resisting against the buckle to prevent the cable with a plug from being accidentally pulled out, an outer diameter of the sleeve being lager than a width of the slot;
   wherein a hook is formed on a distal end of one of the two juts, the hook extends towards the other jut; and
   wherein the buckle comprises two ribs formed on the two opposite sides of the two juts respectively.

2. The cable immobilizing device as claimed in claim 1, wherein the sleeve is a plastic sleeve.

3. The cable immobilizing device as claimed in claim 1, wherein the sleeve is formed by a coiled acetate cloth tape.

4. An electronic device, comprising:
   a shell;
   a socket;
   a plug coupled to the socket;
   a cable connected to the plug; and
   a cable immobilizing device, comprising:
   a buckle positioned on the shell, the buckle comprising two juts facing to each other, the two juts defining a slot therebetween to receive the cable; and
   a sleeve enclosing surround an outer surface portion of the cable and positioned between the buckle and the socket, and configured for resisting against the buckle to prevent the cable with the plug from being accidentally pulled out, an outer diameter of the sleeve being lager than a width of the slot;
   wherein a hook is formed on a distal end of one of the two juts, the hook extends towards the other jut; and
   wherein the buckle comprises two ribs formed on the two opposite sides of the two juts respectively.

5. The electronic device as claimed in claim 4, wherein an angle is defined between a longitudinal of the slot and an inserting direction of the plug, the angle is greater than zero degrees, and smaller than 180 degrees.

6. The electronic device as claimed in claim 5, wherein the angle is 90 degrees.

7. The electronic device as claimed in claim 4, wherein the sleeve is a plastic sleeve.

8. The electronic device as claimed in claim 4, wherein the sleeve is formed by a coiled acetate cloth tape.

* * * * *